US010002213B2

(12) United States Patent
Kadaba

(10) Patent No.: US 10,002,213 B2
(45) Date of Patent: Jun. 19, 2018

(54) SYSTEM AND METHOD FOR VERIFYING THE DETERMINISTIC STARTING STATE OF A DIGITAL DEVICE

(71) Applicant: Oracle International Corporation, Redwood City, CA (US)

(72) Inventor: Satish Keshava Kadaba, Sunnyvale, CA (US)

(73) Assignee: ORACLE INTERNATIONAL CORPORATION, Redwood City, CA (US)

( * ) Notice: Subject to any disclaimer, the term of this patent is extended or adjusted under 35 U.S.C. 154(b) by 275 days.

(21) Appl. No.: 15/169,910

(22) Filed: Jun. 1, 2016

(65) Prior Publication Data
US 2017/0351794 A1    Dec. 7, 2017

(51) Int. Cl.
*G06F 17/50* (2006.01)

(52) U.S. Cl.
CPC ................. *G06F 17/5022* (2013.01)

(58) Field of Classification Search
None
See application file for complete search history.

(56) References Cited

U.S. PATENT DOCUMENTS

| 8,615,735 | B2 | 12/2013 | Mclachlan et al. |
| 8,762,439 | B2 | 6/2014 | De Cesare et al. |
| 9,189,483 | B2 | 11/2015 | Johnston et al. |
| 9,396,725 | B2 | 7/2016 | Ljolje et al. |
| 9,805,200 | B2 | 10/2017 | Huang et al. |
| 2006/0111873 | A1* | 5/2006 | Huang ............. G01R 31/31854 702/185 |
| 2008/0126065 | A1* | 5/2008 | Nicholas ............. G06F 17/5022 703/15 |
| 2011/0072403 | A1* | 3/2011 | Basile ................ G06F 17/5022 716/106 |

* cited by examiner

*Primary Examiner* — Craig C Dorais
(74) *Attorney, Agent, or Firm* — Kilpatrick Townsend & Stockton LLP

(57) ABSTRACT

A system configured to perform a digital simulation of a hardware device, where the hardware device has a digital state component. The system creates an instance of a first module inside a target module associated with the state component, where the source code of the target module remains unmodified by the instance. The system then resets the simulation, such that the state component is set to one of a fixed state and an unknown state, where the unknown state indicates the digital simulation cannot predict how silicon on the hardware device will behave. The system reads an updated value of the digital state component via the instance of the first module, compares the updated value of the digital state component to a desired value of the digital state component, and generates an alert that the updated value does not match the desired value according to the comparison.

20 Claims, 3 Drawing Sheets

SYSTEM AND METHOD FOR VERIFYING THE DETERMINISTIC STARTING STATE OF A DIGITAL DEVICE

BACKGROUND

1. Technical Field

The present disclosure relates to verifying the deterministic starting states of a digital device and more specifically to verifying the starting states without modifying source code of the digital device.

2. Introduction

Hardware programming languages, such as SystemVerilog and VHDL, often use four-value logic systems to represent digital logic behavior: 0, 1, Z (high impedance), and X (unknown, uninitialized, or "don't care"). Values 0, 1, and Z represent values that would exist in the silicon of a real device. An X, however, is used to simulate a degree of uncertainty in how physical hardware will behave under specific circumstances, i.e., when the digital simulation cannot predict if actual silicon would be a 0, 1, or Z. For synthesis, an X can provide engineers a way to specify "don't care" conditions, which can be useful for when an engineer is not concerned with whether actual hardware will have a 0 or 1 for a specific condition.

While X values are particularly useful for programming hardware devices, they can also make digital verification/simulation of the hardware devices difficult. Specifically, the simulation can produce errors based on how X values propagate through digital logic in Register-Transfer-Level (RTL) and gate level simulation models. The term X-optimism refers to a simulation where a logic gate receiving an X value as input outputs a 1 or 0, whereas X-pessimism refers to a simulation where the same logic gate propagates the X value through to the result.

SUMMARY

Additional features and advantages of the disclosure will be set forth in the description which follows, and in part will be obvious from the description, or can be learned by practice of the herein disclosed principles. The features and advantages of the disclosure can be realized and obtained by means of the instruments and combinations particularly pointed out in the appended claims. These and other features of the disclosure will become more fully apparent from the following description and appended claims, or can be learned by the practice of the principles set forth herein.

Disclosed are systems, methods, and non-transitory computer-readable storage media for verifying deterministic starting states of a digital hardware device during a digital simulation. Consider the following example: a system configured to perform the concepts disclosed herein can perform a digital simulation of a hardware device, where the hardware device has a digital state component. The system can then create an instance of a first module inside a target module associated with the digital state component, where the source code of the target module remains unmodified by the instance. The system can then reset the digital simulation, such that the digital state component is set to one of a fixed state and an unknown state, where the unknown state indicates the digital simulation cannot predict how silicon on the hardware device will behave. After performing the resetting, the system can read an updated value of the digital state component via the instance of the first module, compare the updated value of the digital state component to a desired value of the digital state component, and generate an alert that the updated value does not match the desired value according to the comparison (when appropriate).

DETAILED DESCRIPTION

A system, method and computer-readable media are disclosed which verify the deterministic starting states of a digital device and more specifically to verifying the starting states without modifying source code of the digital device. Various embodiments of the disclosure are described in detail below. While specific implementations are described, it should be understood that this is done for illustration purposes only. Other components and configurations may be used without parting from the spirit and scope of the disclosure. A brief introductory description of a basic general purpose system or computing device in FIG. 1 which can be employed to practice the concepts is disclosed herein. A more detailed description of verifying the deterministic starting states will then follow, accompanied by variations and exemplary embodiments. These variations shall be described herein as the various embodiments are set forth. The disclosure now turns to FIG. 1.

Figure 1:
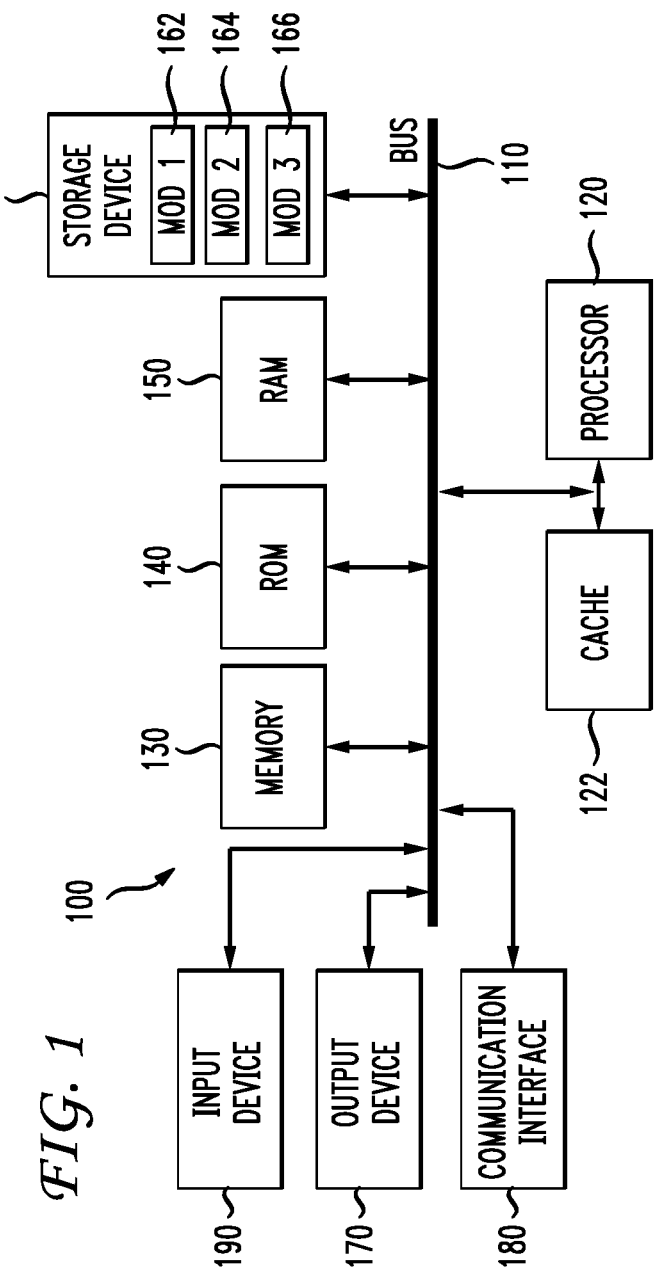
FIG. 1 illustrates an example system embodiment.

With reference to FIG. 1, an exemplary system 100 includes a general-purpose computing device 100, including a processing unit (CPU or processor) 120 and a system bus 110 that couples various system components including the system memory 130 such as read only memory (ROM) 140 and random access memory (RAM) 150 to the processor 120. The system 100 can include a cache 122 of high speed memory connected directly with, in close proximity to, or integrated as part of the processor 120. The system 100 copies data from the memory 130 and/or the storage device 160 to the cache 122 for quick access by the processor 120. In this way, the cache provides a performance boost that avoids processor 120 delays while waiting for data. These and other modules can control or be configured to control the processor 120 to perform various actions. Other system memory 130 may be available for use as well. The memory 130 can include multiple different types of memory with different performance characteristics. It can be appreciated that the disclosure may operate on a computing device 100 with more than one processor 120 or on a group or cluster of computing devices networked together to provide greater processing capability. The processor 120 can include any general purpose processor and a hardware module or software module, such as module 1 162, module 2 164, and module 3 166 stored in storage device 160, configured to control the processor 120 as well as a special-purpose processor where software instructions are incorporated into the actual processor design. The processor 120 may essentially be a completely self-contained computing system, containing multiple cores or processors, a bus, memory controller, cache, etc. A multi-core processor may be symmetric or asymmetric.

The system bus 110 may be any of several types of bus structures including a memory bus or memory controller, a peripheral bus, and a local bus using any of a variety of bus architectures. A basic input/output (BIOS) stored in ROM 140 or the like, may provide the basic routine that helps to transfer information between elements within the computing device 100, such as during start-up. The computing device 100 further includes storage devices 160 such as a hard disk drive, a magnetic disk drive, an optical disk drive, tape drive or the like. The storage device 160 can include software modules 162, 164, 166 for controlling the processor 120. Other hardware or software modules are contemplated. The storage device 160 is connected to the system bus 110 by a drive interface. The drives and the associated computer-readable storage media provide nonvolatile storage of computer-readable instructions, data structures, program modules and other data for the computing device 100. In one aspect, a hardware module that performs a particular function includes the software component stored in a tangible computer-readable storage medium in connection with the necessary hardware components, such as the processor 120, bus 110, display 170, and so forth, to carry out the function. In another aspect, the system can use a processor and computer-readable storage medium to store instructions which, when executed by the processor, cause the processor to perform a method or other specific actions. The basic components and appropriate variations are contemplated depending on the type of device, such as whether the device 100 is a small, handheld computing device, a desktop computer, or a computer server.

Although the exemplary embodiment described herein employs the hard disk 160, other types of computer-readable media which can store data that are accessible by a computer, such as magnetic cassettes, flash memory cards, digital versatile disks, cartridges, random access memories (RAMs) 150, and read only memory (ROM) 140, may also be used in the exemplary operating environment. Tangible computer-readable storage media, computer-readable storage devices, or computer-readable memory devices, expressly exclude media such as transitory waves, energy, carrier signals, electromagnetic waves, and signals per se.

To enable user interaction with the computing device 100, an input device 190 represents any number of input mechanisms, such as a microphone for speech, a touch-sensitive screen for gesture or graphical input, keyboard, mouse, motion input, speech and so forth. An output device 170 can also be one or more of a number of output mechanisms known to those of skill in the art. In some instances, multimodal systems enable a user to provide multiple types of input to communicate with the computing device 100. The communications interface 180 generally governs and manages the user input and system output. There is no restriction on operating on any particular hardware arrangement and therefore the basic features here may easily be substituted for improved hardware or firmware arrangements as they are developed.

For clarity of explanation, the illustrative system embodiment is presented as including individual functional blocks including functional blocks labeled as a "processor" or processor 120. The functions these blocks represent may be provided through the use of either shared or dedicated hardware, including, but not limited to, hardware capable of executing software and hardware, such as a processor 120, that is purpose-built to operate as an equivalent to software executing on a general purpose processor. For example the functions of one or more processors presented in FIG. 1 may be provided by a single shared processor or multiple processors. (Use of the term "processor" should not be construed to refer exclusively to hardware capable of executing software.) Illustrative embodiments may include microprocessor and/or digital signal processor (DSP) hardware, read-only memory (ROM) 140 for storing software performing the operations described below, and random access memory (RAM) 150 for storing results. Very large scale integration (VLSI) hardware embodiments, as well as custom VLSI circuitry in combination with a general purpose DSP circuit, may also be provided.

The logical operations of the various embodiments are implemented as: (1) a sequence of computer implemented steps, operations, or procedures running on a programmable circuit within a general use computer, (2) a sequence of computer implemented steps, operations, or procedures running on a specific-use programmable circuit; and/or (3) interconnected machine modules or program engines within the programmable circuits. The system 100 shown in FIG. 1 can practice all or part of the recited methods, can be a part of the recited systems, and/or can operate according to instructions in the recited tangible computer-readable storage media. Such logical operations can be implemented as modules configured to control the processor 120 to perform particular functions according to the programming of the module. For example, FIG. 1 illustrates three modules Mod1 162, Mod2 164 and Mod3 166 which are modules configured to control the processor 120. These modules may be stored on the storage device 160 and loaded into RAM 150 or memory 130 at runtime or may be stored in other computer-readable memory locations.

Figure 2:
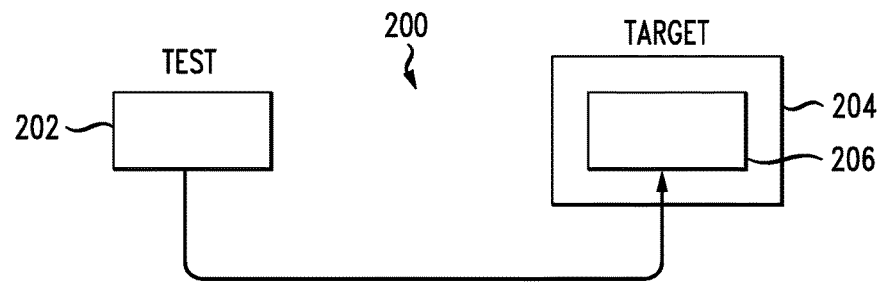
FIG. 2 illustrates an example of creating an instance of a first module within a target module.

Having disclosed some components of a computing system, the disclosure now turns to FIG. 2, which illustrates an example 200 of creating an instance of a first module within a target module. This allows an assertion to be added to a design without modifying the original source code, thereby adding an ability to perform a verification of memory contents in a non-obtrusive way. For example, within SystemVerilog, a "bind" command can be used to perform the instantiation.

A SystemVerilog bind file or module 202 can be externally instantiated into the target design module 204 without making any modification to the target module 204 itself. The SystemVerilog bind command can be used to externally instantiate, or to "bind" the assertion module 202 into the target module 204, visualized with the test module 206 being replicated "inside" the target module 204.

Because SystemVerilog assertions are found in an enclosing module with ports, this creates its own scope and the signal names of the assertions do not have to match the signal names of the target module 204. The mapping of target signal names to assertion-file signal names can happen when the assertion module ports are connected through the bind-instantiation to the target module ports using standard Verilog named port connections or Verilog positional port connections.

Figure 3:
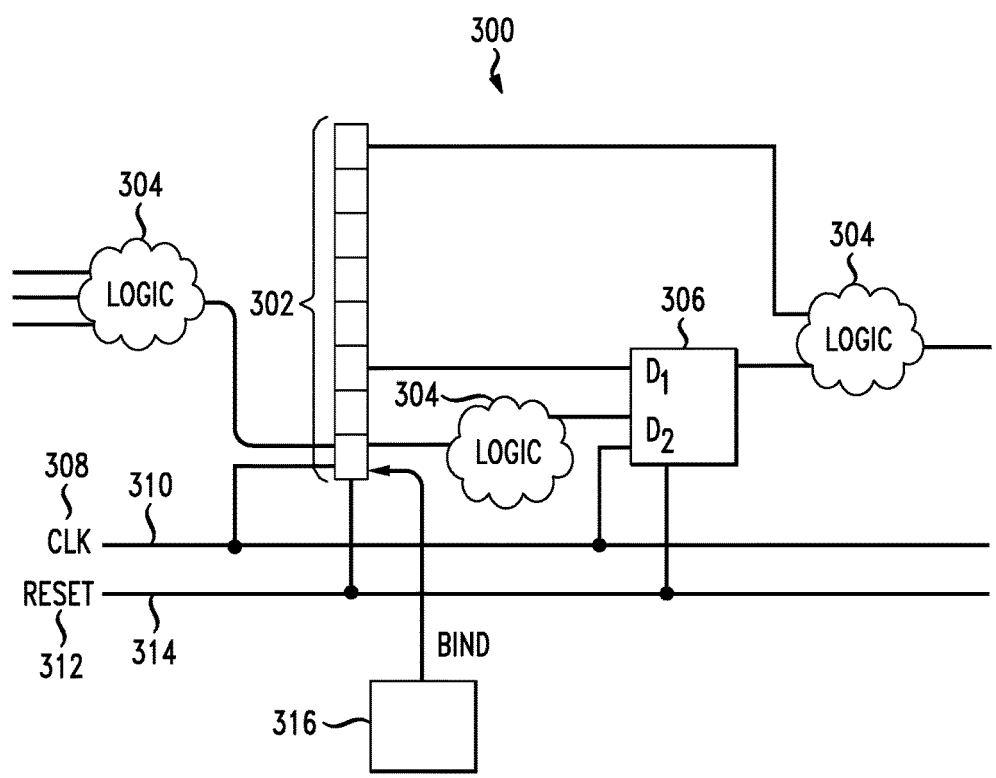
FIG. 3 illustrates exemplary digital simulation.

When the digital simulation is reset, the states of various digital components being simulated may be verified. FIG. 3 illustrates an exemplary digital simulation 300 of a physical hardware device. Within this digital simulation are a number of digital state components 302, 306 which can contain values of 0, 1, X, or Z. The digital simulation also has logic components 304, a clock signal "CLK" associated with a clock line 310, and a reset signal "RESET" 312 associated with a reset line 314. These components are non-limiting examples of signals within the digital simulation. For example, a RESET operation can be performed by different methods than using a reset line 314. The simulation 300 can reset these digital state components 302, 306 to starting states using the Reset 312 signal, as required. In order to verify the Reset 312 has worked correctly, a bind function 316 (or similar function) is used to instantiate a copy of a first module into a state component 302.

Consider the following example: the simulation 300 of FIG. 3 is running, with the clock 308 regularly causing the logic 304 systems to push new data to the state components 302, 306 using the clock line 310. An instance of a first module 316 has been created inside a target module of a digital state component (such as any individual block of 302, or digital state component 306). The simulation 300 is then reset (which can either be triggered by a system processor or a user) via the reset line 314. A reset can, for example, be performed after an arbitrary or predetermined number of simulation cycles to verify the starting state check mechanisms described herein are still applicable. To verify the state of the target module of the digital state component to which the first module 316 was assigned, the system or a user compares the new value of the digital state component (post-reset) to a desired value. If the new value matches the desired value, the simulation 300 can simply move on. If, however, the new value of the state component does not match the desired value, it can be indicative of an error of which the system, simulation, and/or user should be aware. In certain cases, this means that the system and/or simulation compiles a list of instances where the desired value does not match the actual value. In other cases, the distinction can cause an alert to be forwarded to a registry and/or user for later correction.

Figure 4:
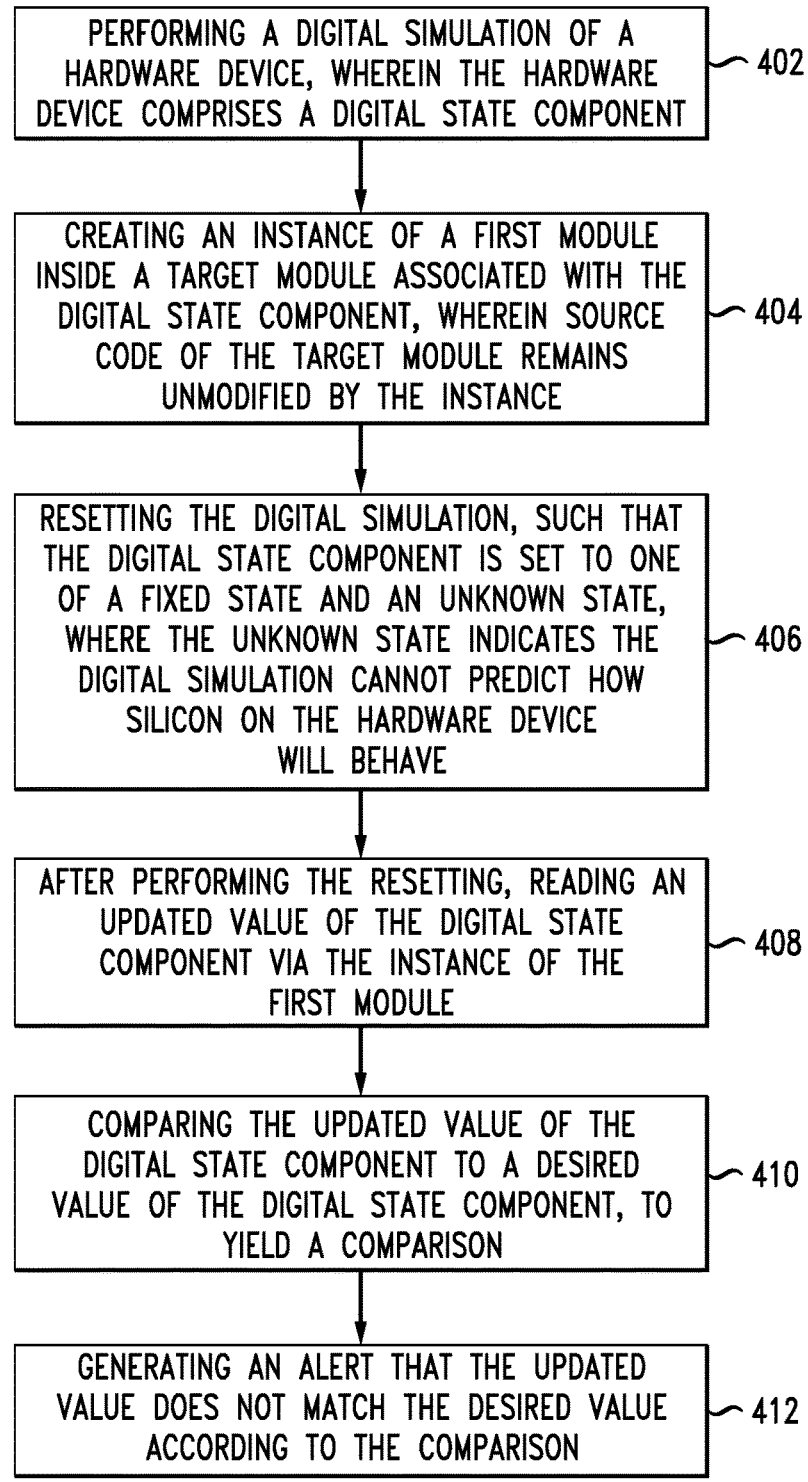
FIG. 4 illustrates an example method embodiment.

Having disclosed some basic system components and concepts, the disclosure now turns to the exemplary method embodiment shown in FIG. 4. For the sake of clarity, the method is described in terms of an exemplary system 100 as shown in FIG. 1 configured to practice the method. The steps outlined herein are exemplary and can be implemented in any combination thereof, including combinations that exclude, add, or modify certain steps.

The system 100 performs a digital simulation of a hardware device, wherein the hardware device comprises a digital state component (402). The system 100 creates an instance of a first module inside a target module associated with the digital state component, wherein source code of the target module remains unmodified by the instance (404). For example, the instance can be created as part of a hardware description language program being fed to and executed by a processor of the system, the processor being specifically configured to simulate designs of physical integrated circuit designs. The system 100 resets the digital simulation, such that the digital state component is set to one of a fixed state and an unknown state, where the unknown state indicates the digital simulation cannot predict how silicon on the hardware device will behave (406). After performing the resetting, the system 100 reads an updated value of the digital state component via the instance of the first module (408), then compares the updated value of the digital state component to a desired value of the digital state component, to yield a comparison (410). In certain configurations, the system 100 can then generate an alert that the updated value does not match the desired value according to the comparison (412).

The hardware description language can, for example, be Verilog, SystemVerilog, VHDL, or other languages used to simulate physical signal processing devices. The system 100 can perform actions, such as the reading of the updated value according to either a positive clock edge or negative clock edge coming from a processor—for example, the processor being used to run the digital simulation, or a derivative of that processor's clock.

The system 100 can also record the updated value(s) as part of a record of the digital simulation. For example, after the reset, as the values of the state component(s) are read using the instantiated modules, those updated values can be saved to registers, memory, or databases for later retrieval and analysis. This record can include data regarding a single digital state component or can include additional modules associated with other digital state components of the simulation. At a future point, the system 100 or a user can perform analyses using the stored data.

While the concepts disclosed herein apply to both "optimistic" simulations (those that assign 0 or 1 to state components where the design engineer placed an X) and "pessimistic" simulations (those where the engineer's X remains and is passed through logic gates), the concepts are particularly helpful to the pessimistic models.

Embodiments within the scope of the present disclosure may also include tangible and/or non-transitory computer-readable storage media for carrying or having computer-executable instructions or data structures stored thereon. Such tangible computer-readable storage media can be any available media that can be accessed by a general purpose or special purpose computer, including the functional design of any special purpose processor as described above. By way of example, and not limitation, such tangible computer-readable media can include RAM, ROM, EEPROM, CD-ROM or other optical disk storage, magnetic disk storage or other magnetic storage devices, or any other medium which can be used to carry or store desired program code means in the form of computer-executable instructions, data structures, or processor chip design. When information is transferred or provided over a network or another communications connection (either hardwired, wireless, or combination thereof) to a computer, the computer properly views the connection as a computer-readable medium. Thus, any such connection is properly termed a computer-readable medium. Combinations of the above should also be included within the scope of the computer-readable media.

Computer-executable instructions include, for example, instructions and data which cause a general purpose computer, special purpose computer, or special purpose processing device to perform a certain function or group of functions. Computer-executable instructions also include program modules that are executed by computers in stand-alone or network environments. Generally, program modules include routines, programs, components, data structures, objects, and the functions inherent in the design of special-purpose processors, etc. that perform particular tasks or implement particular abstract data types. Computer-executable instructions, associated data structures, and program modules represent examples of the program code means for executing steps of the methods disclosed herein. The particular sequence of such executable instructions or associated data structures represents examples of corresponding acts for implementing the functions described in such steps.

Other embodiments of the disclosure may be practiced in network computing environments with many types of computer system configurations, including personal computers, hand-held devices, multi-processor systems, microprocessor-based or programmable consumer electronics, network PCs, minicomputers, mainframe computers, and the like. Embodiments may also be practiced in distributed computing environments where tasks are performed by local and remote processing devices that are linked (either by hardwired links, wireless links, or by a combination thereof) through a communications network. In a distributed computing environment, program modules may be located in both local and remote memory storage devices.

The various embodiments described above are provided by way of illustration only and should not be construed to limit the scope of the disclosure. For example, the principles herein can be applied to any simulation of a programmable hardware device. Various modifications and changes may be made to the principles described herein without following the example embodiments and applications illustrated and described herein, and without departing from the spirit and scope of the disclosure.

I claim:

1. A method comprising:
   performing a digital simulation of a hardware device comprising a digital state component;
   creating an instance of a first module inside a target module associated with the digital state component, wherein source code of the target module remains unmodified by the instance;
   resetting the digital simulation, such that the digital state component is set to one of a fixed state and an unknown state, where the unknown state indicates the digital simulation cannot predict how a silicon portion on the hardware device will behave;
   reading an updated value of the digital state component via the instance of the first module, wherein the reading of the updated value is performed according to a positive clock edge or to a negative clock edge;
   comparing the updated value of the digital state component to a desired value of the digital state component to yield a comparison; and
   generating an alert that the updated value does not match the desired value according to the comparison.

2. The method of claim 1, wherein the digital simulation utilizes a version of Verilog.

3. The method of claim 1, wherein the reading of the updated value is performed according to the positive clock edge.

4. The method of claim 1, wherein the reading of the updated value is performed according to the negative clock edge.

5. The method of claim 1, further comprising recording the updated value as part of a record of the digital simulation.

6. The method of claim 5, wherein the record of the digital simulation further comprises updated values of additional target modules.

7. The method of claim 1, wherein the digital simulation passes X values through digital state components.

8. A system comprising:
   a processor; and
   a computer-readable storage medium having instructions stored which, when executed by the processor, cause the processor to perform operations comprising:
      performing a digital simulation of a hardware device comprising a digital state component;
      creating an instance of a first module inside a target module associated with the digital state component, wherein source code of the target module remains unmodified by the instance;
      resetting the digital simulation, such that the digital state component is set to one of a fixed state and an unknown state, where the unknown state indicates the digital simulation cannot predict how a silicon portion on the hardware device will behave;
      reading an updated value of the digital state component via the instance of the first module, wherein the reading of the updated value is performed according to a positive clock edge or to a negative clock edge;
      comparing the updated value of the digital state component to a desired value of the digital state component to yield a comparison; and
      generating an alert that the updated value does not match the desired value according to the comparison.

9. The system of claim 8, wherein the digital simulation utilizes a version of Verilog.

10. The system of claim 8, wherein the reading of the updated value is performed according to the positive clock edge.

11. The system of claim 8, wherein the reading of the updated value according to a negative clock edge.

12. The system of claim 8, the computer-readable storage medium having instructions stored which, when executed by the processor, cause the processor to perform operations comprising recording the updated value as part of a record of the digital simulation.

13. The system of claim 12 wherein the record of the digital simulation further comprises updated values of additional target modules.

14. The system of claim 8, wherein the digital simulation passes X values through digital state components.

15. A computer-readable storage device having instructions stored which, when executed by a computing device, cause the computing device to perform operations comprising:
   performing a digital simulation of a hardware device, wherein the hardware device comprises a digital state component;
   creating an instance of a first module inside a target module associated with the digital state component, wherein source code of the target module remains unmodified by the instance;
   resetting the digital simulation, such that the digital state component is set to one of a fixed state and an unknown state, where the unknown state indicates the digital simulation cannot predict how a silicon portion on the hardware device will behave;
   after performing the resetting, reading an updated value of the digital state component via the instance of the first module, wherein the reading of the updated value is performed according to a positive clock edge or to a negative clock edge;
   comparing the updated value of the digital state component to a desired value of the digital state component to yield a comparison; and
   generating an alert that the updated value does not match the desired value according to the comparison.

16. The computer-readable storage device of claim 15, wherein the digital simulation utilizes a version of Verilog.

17. The computer-readable storage device of claim 15, wherein the reading of the updated value is performed according to a positive clock edge.

18. The computer-readable storage device of claim 15, wherein the reading of the updated value is performed according to a negative clock edge.

19. The computer-readable storage device of claim 15, having instructions stored which, when executed by the computing device, cause the computing device to perform operations comprising recording the updated value as part of a record of the digital simulation.

20. The computer-readable storage device of claim 19 wherein the record of the digital simulation further comprises updated values of additional target modules.

* * * * *